(12) United States Patent
Schaedlich

(10) Patent No.: US 9,733,303 B2
(45) Date of Patent: Aug. 15, 2017

(54) INTERLOCK DETECTOR WITH SELF-DIAGNOSIS FUNCTION FOR AN INTERLOCK CIRCUIT, AND METHOD FOR THE SELF-DIAGNOSIS OF THE INTERLOCK DETECTOR

(71) Applicants: Robert Bosch GmbH, Stuttgart (DE); Samsung SDI Co., Ltd., Yongin-si, Gyeonggi-do (KR)

(72) Inventor: Thomas Schaedlich, Kornwestheim (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 138 days.

(21) Appl. No.: 14/388,803

(22) PCT Filed: Mar. 11, 2013

(86) PCT No.: PCT/EP2013/054805
§ 371 (c)(1),
(2) Date: Sep. 26, 2014

(87) PCT Pub. No.: WO2013/143828
PCT Pub. Date: Oct. 3, 2013

(65) Prior Publication Data
US 2015/0331041 A1    Nov. 19, 2015

(30) Foreign Application Priority Data

Mar. 28, 2012    (DE) .................. 10 2012 204 960

(51) Int. Cl.
*G01R 31/28*    (2006.01)
*B60L 3/00*    (2006.01)
(Continued)

(52) U.S. Cl.
CPC ........ *G01R 31/2884* (2013.01); *B60L 3/0046* (2013.01); *B60L 3/0069* (2013.01);
(Continued)

(58) Field of Classification Search
USPC .................................. 324/750.3, 76.11, 73.1
See application file for complete search history.

(56) References Cited

U.S. PATENT DOCUMENTS 4,191,913 A * 3/1980 Arnold ..................... G05D 3/12
318/563
4,629,976 A    12/1986 Pipkorn
5,870,317 A * 2/1999 Barnett .............. G05B 23/0256
307/115

FOREIGN PATENT DOCUMENTS

DE            103 55 326 A1    11/2004
DE    10 2006 055 315 A1    6/2008
(Continued)

OTHER PUBLICATIONS

International Search Report corresponding to PCT Application No. PCT/EP2013/054805, mailed Jan. 2, 2014 (German and English language document) (7 pages).

(Continued)

*Primary Examiner* — Vincent Q Nguyen
(74) *Attorney, Agent, or Firm* — Maginot, Moore & Beck LLP

(57) ABSTRACT

The interlock detector includes a first input, wherein a first output signal from an interlock generator is applied to the first input. The interlock detector further includes a second output which is configured to provide a microprocessor with a second output signal. The interlock detector further includes a differential amplifier that includes a second input, a third input, and a third output, wherein the second input and the third input are connected to the first input. The interlock detector further includes a comparator circuit that (Continued)

includes a fourth input and a fourth output, wherein the fourth input is connected to the third output, the fourth output is connected to the second output, and the fourth input is positioned between the comparator circuit and the differential amplifier.

10 Claims, 3 Drawing Sheets

(51) Int. Cl.
*B60L 3/04* (2006.01)
*B60L 3/12* (2006.01)

(52) U.S. Cl.
CPC *B60L 3/04* (2013.01); *B60L 3/12* (2013.01); *G01R 31/2827* (2013.01); *G01R 31/2834* (2013.01)

(56) References Cited

FOREIGN PATENT DOCUMENTS

DE 10 2009 028 173 A1 2/2011
DE 10 2010 031 456 A1 1/2012

OTHER PUBLICATIONS

Brian Harrington; BIST for Analog Weenies; Jun. 29, 2010; 2 Pages; Analog Devices, Inc.

\* cited by examiner

INTERLOCK DETECTOR WITH SELF-DIAGNOSIS FUNCTION FOR AN INTERLOCK CIRCUIT, AND METHOD FOR THE SELF-DIAGNOSIS OF THE INTERLOCK DETECTOR

This application is a 35 U.S.C. §371 National Stage Application of PCT/EP2013/054805, filed on Mar. 11, 2013, which claims the benefit of priority to Serial No. DE 10 2012 204 960.6, filed on Mar. 28, 2012 in Germany, the disclosures of which are incorporated herein by reference in their entirety.

The present disclosure relates to an interlock detector for an interlock circuit, which interlock detector is implemented in a battery control device and enables a functional test/diagnosis of itself even if the interlock circuit is interrupted and without the application of external (generator) signals.

BACKGROUND

DE 10 2010 031 456 discloses a method for the safety-related disconnection of an electrical network, in which use is made of an interlock circuit (also called safety line loop, interlock or pilot line), the interruption of which disconnects an electrical energy source belonging to the electrical network or decouples it from the electrical network if there is a fear of danger to persons by live parts.

An interlock circuit which is in the form of a signal loop is therefore used in electrical networks, for example in vehicles, having a nominal voltage which exceeds 60 volts. The so-called interlock signal is generally generated using a so-called interlock generator in an energy source (for example in a battery) which supplies the electrical network with power. The signal is passed through all connectors of the electrical network and all components connected to the network, that is to say via passive and/or active so-called interlock participants. In this case, the system is configured in such a manner that, when a plug-in connection or a cover which prevents access to live parts is opened, the interlock circuit is inevitably interrupted. The signal is evaluated in all network participants which act as an energy source. If the interlock circuit is interrupted, each of these components disconnects the supply of energy into the network and possibly discharges the network. The typically required time between the interruption of the interlock circuit and the disconnection of the network protected by the latter is in the range below one second.

An interlock detector is usually situated at the end or else at another position of such an interlock circuit, which interlock detector is implemented in a battery control device, evaluates the interlock signal and supplies this evaluation to the battery control device.

FIG. 1 shows a basic circuit diagram of such an interlock detector implemented in an interlock detector system according to the prior art. In this case, the interlock detector 50 is connected to an interlock circuit 60 and to a microprocessor 30. In the interlock circuit 60, an interlock signal 26 is generated by an interlock generator 40, which signal is passed, in the interlock circuit 60, via an interlock circuit resistor 14, a measuring resistor 4 and optionally further active and/or passive interlock participants 7. The interlock signal 26 causes a defined voltage drop across the measuring resistor 4 of the interlock circuit 60. This defined voltage drop is tapped off via a differential amplifier 20 consisting of an operational amplifier 12 having a respective resistor 3, 6, 8 both in its two input branches and in its feedback branch, is possibly adapted to the signal level to be evaluated at an input branch of the operational amplifier 12 using an offset voltage Uref1 and is amplified. The amplified signal is supplied to a comparator circuit 10 via the output 13 of the differential amplifier 20. The comparator circuit 10 consists of two operational amplifiers 16, 18 in which an input of one operational amplifier 16 is connected to an input of the other operational amplifier 18. The signal passed to this connection 13 by the differential amplifier 20 is compared, by the first operational amplifier 16 of the comparator circuit 10, with an upper limit value Uref2 which is supplied to the unconnected input of the operational amplifier 16. The signal resulting from the evaluation of the comparison is supplied directly to the microprocessor 30 via the output 9 of the operational amplifier 16 of the comparator circuit 10. The signal passed to the connection 13 by the differential amplifier 20 is compared, by the second operational amplifier 18 of the comparator circuit 10, with a lower limit value which is supplied to the unconnected input of the operational amplifier 18. The signal resulting from the evaluation of the comparison is supplied directly to the microprocessor 30 via the output 24 of the operational amplifier 18 of the comparator circuit 10. The received signals are then evaluated in the microprocessor within an interval of time and are compared with a desired value.

SUMMARY

The interlock detector according to the disclosure comprises a first input to which an output signal from an interlock generator is applied, an output for providing a microprocessor with an output signal, a differential amplifier, the first and second inputs of which are connected to the first input of the interlock detector, and a comparator circuit, the input of which is connected to the output of the differential amplifier and the output of which is connected to the output of the interlock detector. Furthermore, the interlock detector has at least one second input to which a diagnosis signal is applied, the at least one second input being connected to the input of the comparator circuit between the comparator circuit and the differential amplifier and/or being connected to one of the first or second inputs of the differential amplifier between the first input of the interlock detector and the differential amplifier.

The advantage of the interlock detector according to the disclosure is the possibility of being able to check the functionality or integrity of individual components or of the entire interlock detector, even without the presence of a connection between the interlock detector and the interlock circuit or the interlock generator, by supplying diagnosis signals via the second inputs of the interlock detector. Circuit parts of the interlock detector can be individually and continuously stimulated via the diagnosis signals and their functionality or integrity can therefore be checked. The interaction between the interlock detector and the interlock generator therefore becomes superfluous for the purpose of testing and the function of the interlock detector can be checked even when the battery is disassembled, that is to say when the interlock circuit is open.

In one preferred embodiment, the interlock detector has a plurality of, preferably four, second inputs, two of which are connected to the first or second input of the differential amplifier between the first input of the interlock detector and the differential amplifier. A third second input is connected to the first input of the interlock detector or to the connecting piece between the first input of the interlock detector and the inputs of the differential amplifier via the first or second input of the differential amplifier. The remaining second input is connected to the input of the comparator circuit between the comparator circuit and the differential amplifier or to the connecting piece between the comparator circuit and the differential amplifier. Such an embodiment makes it possible to deliberately control the comparator thresholds of the comparator circuit in small steps and therefore to accurately check the function of the comparator circuit. Further diagnosis signals can be used, for example, to check the functionality of the inputs of the differential amplifier and of the interlock detector and, alternatively or additionally, a diagnosis signal can be used to concomitantly include the offset voltage, which is supplied to an input of the differential amplifier, in the test. The functionality or integrity of the first input of the interlock detector, which can be implemented by means of a measuring resistor and the two inputs of the differential amplifier in one exemplary embodiment, can be checked using the connection between the one second input and the first input of the interlock detector.

The connection between the input of the comparator circuit and the output of the differential amplifier can preferably be interrupted via an additional switching means for diagnosing the comparator circuit.

The additional switching means for interrupting the connection between the input of the comparator circuit and the output of the differential amplifier is preferably downstream of the output of the differential amplifier and upstream of the connection between the second input and the input of the comparator circuit. Opening the switching means between the input of the comparator circuit and the output of the differential amplifier makes it possible to ensure that the diagnosis signal supplied to the input of the comparator circuit cannot be influenced by the differential amplifier or by interference signals coming from the latter.

In one preferred embodiment, electrical connection paths between the second inputs of the interlock detector and the input of the comparator circuit and/or the inputs of the differential amplifier and the first input of the interlock detector are each provided with at least one switching means. Such a circuit arrangement provides a wide diagnostic range which can be reduced or increased by opening or closing the switching means in the electrical connection paths. Individual diagnosis signals can therefore be added or have other diagnosis signals superimposed on them by closing the switching means, while particular diagnosis signals can be excluded from the diagnosis by opening the switching means.

One input of the differential amplifier preferably has an additional connection for applying an offset voltage. Such an offset voltage can be used to adapt the input signal of the differential amplifier to a particular signal level to be evaluated by the comparator circuit.

The output of the interlock detector is preferably formed by the two outputs of the comparator circuit which are directly connected to the microprocessor. The advantage of such an implementation is the direct, low-loss transmission of the output signals from the comparator circuit to the microprocessor without the signals having to be "post-processed" in intermediate units. The signal obtained from a differential amplifier is therefore compared with a reference signal, for example, entirely in the comparator circuit, as a result of which the microprocessor is spared computational effort, which saves costs and space for implementing the microprocessor.

One preferred embodiment implements an interlock detector system having an interlock circuit, an interlock generator, an interlock detector, and a microprocessor, the first input of the interlock detector being connected to the interlock generator, and the output of the interlock detector being connected to the microprocessor for evaluating the output signals from the interlock detector, the microprocessor being connected to the at least one second input of the interlock detector for the purpose of providing a signal for diagnosing the interlock detector.

The advantage of such a system is that the generation of the diagnosis signals and their evaluation are combined in a digital signal-processing system, the microprocessor. This makes it possible to carry out the evaluation in a more accurate manner since fluctuations in the diagnosis signals themselves and during their generation can be concomitantly taken into account during evaluation. Furthermore, two data-processing systems need not be provided in the circuit arrangement, thus saving costs and space.

In one preferred further development of the above embodiment of the interlock detector system, the microprocessor is designed to directly generate the diagnosis signals for the interlock detector or to respectively generate the diagnosis signals via pulse width modulation signals and a respective low-pass filter between the microprocessor and the second input of the interlock detector. The advantage of such generation of the analog signal is the type of signal generation itself. The analog signal is generated with low loss using "low and high levels", as a result of which less energy needs to be used to generate the signals.

At least one switching means is preferably present between the first input of the interlock detector and the interlock generator of the interlock detector system. The interlock detector can be decoupled from the interlock generator and from the interlock circuit by opening the switching means. This is advantageous, for example while supplying a diagnosis signal, since interfering influences on the diagnosis signal by the interlock circuit or the interlock generator can be excluded by opening the switching means.

The first input of the interlock detector is preferably formed by the two inputs of the differential amplifier which tap off the input voltage of the interlock detector via a measuring resistor in the interlock circuit.

Provision is also made of a method for the self-diagnosis of an interlock detector system comprising an interlock circuit, an interlock generator, an interlock detector having a first input to which an output signal from an interlock generator is applied, an output for providing a microprocessor with an output signal, a differential amplifier, the first and second inputs of which are connected to the first input of the interlock detector, and a comparator circuit, the input of which is connected to the output of the differential amplifier and the output of which is connected to the output of the interlock detector, and a microprocessor. The method comprises the following method steps of: disconnecting the interlock detector from the interlock circuit by opening at least one switching means; generating a diagnosis signal for the interlock detector by the microprocessor; supplying a diagnosis signal, via at least one second input of the interlock detector, to the input of the comparator circuit between the comparator circuit and the differential amplifier and/or to at least one input of the differential amplifier between the differential amplifier and the first input of the interlock detector; and evaluating the output signal from the interlock detector in the microprocessor.

In one preferred further development of the above method for the self-diagnosis of an interlock detector system, the method also comprises the step of disconnecting the comparator circuit from the differential amplifier.

A battery having an interlock detector according to the disclosure is preferably implemented, the battery particularly preferably being in the form of a lithium ion battery. The advantage of lithium ion batteries is their comparatively high energy density.

A motor vehicle having a battery with an interlock detector according to the disclosure is preferably implemented, the battery being connected to a drive system of the motor vehicle.

BRIEF DESCRIPTION OF THE DRAWINGS

Exemplary embodiments of the disclosure are explained in more detail using the drawings and the following description. In the drawings.

DETAILED DESCRIPTION

Figure 2:
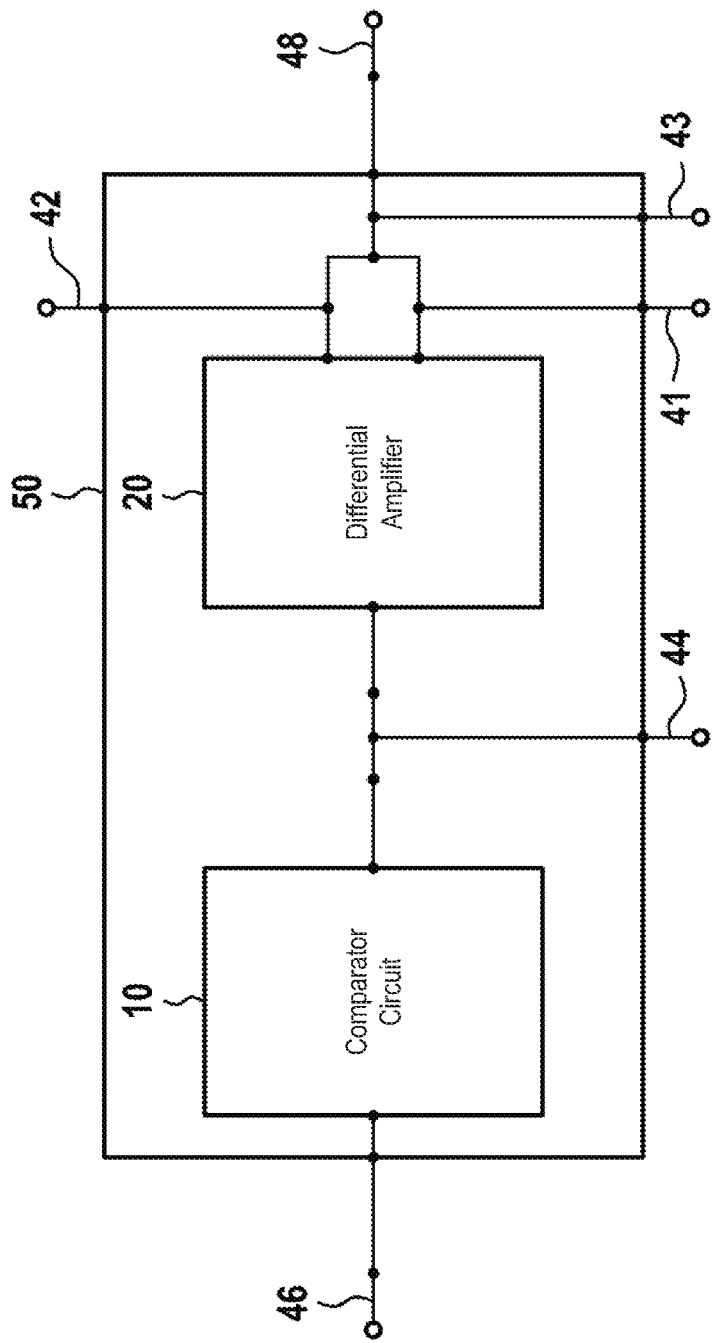
FIG. 2 shows a basic circuit diagram of an interlock detector according to the disclosure.

FIG. 2 shows a basic circuit diagram of an interlock detector 50 according to the disclosure. The interlock detector 50 has a first input 48, which can be used to tap off the output signal from an interlock generator, and an output 46, which can be used to transmit the output signal to a microprocessor. The first input 48 is connected to the first and second inputs of a differential amplifier 20. The output of the differential amplifier 20 is connected to the input of a comparator circuit 10. The output of the comparator circuit 10 is connected to the output 46 of the interlock detector 50. The illustrated interlock detector 50 according to the disclosure also has, purely by way of example, four further second inputs 41, 42, 43, 44 which can be used to supply diagnosis signals to the circuit. Two second inputs 41, 42 of the interlock detector 50 are connected to one of the first or second inputs of the differential amplifier 20 between the input 48 of the interlock detector 50 and the differential amplifier 20. A third second input 43 is connected to the first input 48 of the interlock detector 50 or to the connecting piece between the first input 48 of the interlock detector 50 and the inputs of the differential amplifier 20 via the first or second input of the differential amplifier 20. The remaining second input 44 is connected to the input of the comparator circuit 10 between the comparator circuit 10 and the differential amplifier 20 or to the connecting piece between the comparator circuit 10 and the differential amplifier 20. The third second input 43 is optionally directly connected to the first input 48 of the interlock detector 50.

The disclosure therefore relates to an interlock detector 50, to the first input 48 of which the output signal from an interlock generator is supplied. The output signal from the interlock generator is transmitted to a differential amplifier 20, the two inputs of which are connected to the first input 48 of the interlock detector 50. The output of the differential amplifier 20 is connected to the input of a comparator circuit 10 which compares the amplified input signal transmitted by the differential amplifier 20 with a reference value. The output of the comparator circuit 10 is connected to the output 46 of the interlock detector 50, to which the comparator circuit 10 transmits its output signal. Diagnosis signals can be supplied to different locations of the interlock detector 50 via four second inputs 41, 42, 43, 44 of the interlock detector 50. Two second inputs 41, 42 are preferably connected to one of the first or second inputs of the differential amplifier 20 between the first input 48 of the interlock detector 50 and the differential amplifier 20 and can be used to supply a diagnosis signal to the respective input of the differential amplifier 20. A third second input 43 is connected to the first input 48 of the interlock detector 50 or to the connecting piece between the first input 48 of the interlock detector 50 and the two inputs of the differential amplifier 20 via the first or second input of the differential amplifier 20. It can be used to diagnose precisely this first input 48. A second input 44 is preferably connected to the input of the comparator circuit 10 between the comparator circuit 10 and the differential amplifier 20 or to the connecting piece between the comparator circuit 10 and the differential amplifier 20 in order to supply a diagnosis signal to the input of the comparator circuit 10. However, only one second input, two second inputs or three second inputs can also be present in any desired combination.

Figure 1:
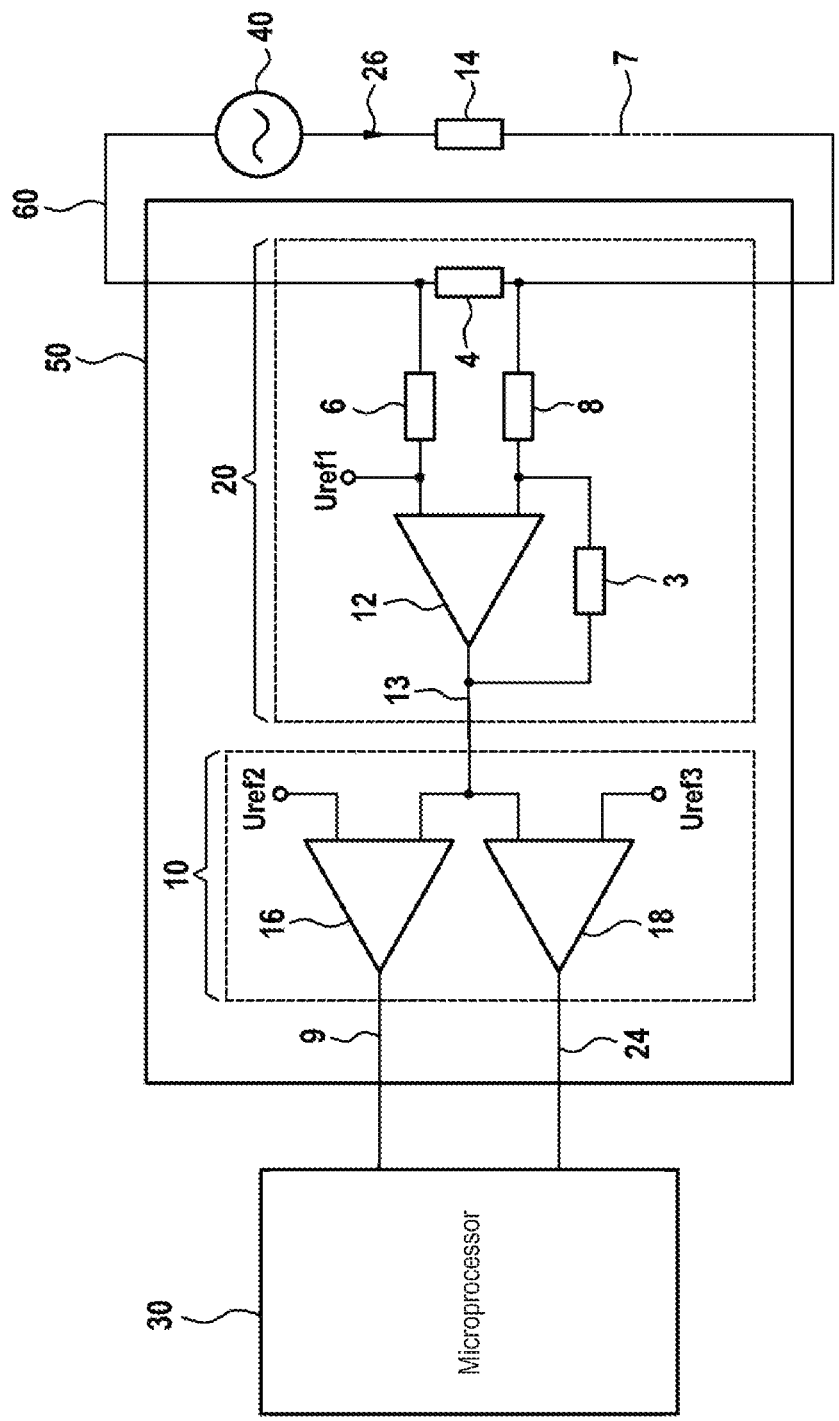
FIG. 1 shows a basic circuit diagram of an interlock detector implemented in an interlock detector system according to the prior art.
Figure 3:
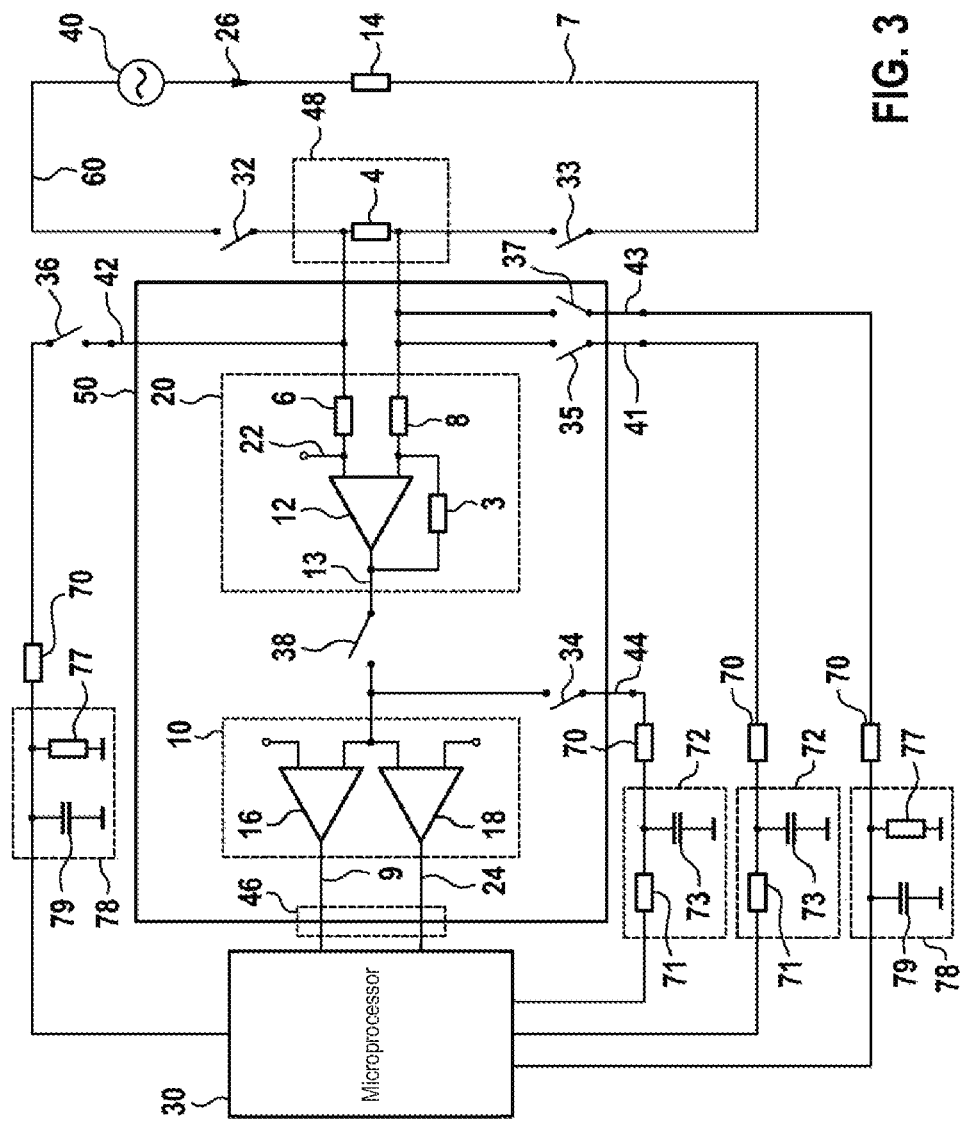
FIG. 3 shows a special embodiment of the interlock detector system with an interlock detector.

FIG. 3 shows a special embodiment of the interlock detector system having an interlock detector 50. The illustration shows a special embodiment of an interlock detector 50 according to the disclosure including an interlock circuit 60 with an interlock generator 40, an interlock signal 26, an interlock circuit resistor 14, two switching means 32, 33 which can be used to decouple the interlock circuit 60 from the interlock detector 50 and interlock participants 7 (not depicted), as well as a microprocessor 30. The comparator circuit 10 and the differential amplifier 20 are implemented as illustrated in FIG. 1. The output of the differential amplifier 20 is connected to the first end of a switching means 38, while the second end of the switching means 38 is connected to the input of the comparator circuit 10. The first input 48 and the output 46 of the interlock detector 50 are also implemented as illustrated in FIG. 1, with the result that the interlock detector 50 is connected to the interlock circuit 60 via the measuring resistor 4 and the comparator circuit 10 is connected to the microprocessor 30 via the two outputs 9, 24 of the two operational amplifiers 16, 18. The interlock detector 50 in FIG. 3 also has four further second inputs 41, 42, 43, 44 which are used to supply diagnosis signals to the interlock detector system. Purely by way of example, two of the second inputs 41, 42 are connected to one of the first or second inputs of the differential amplifier 20 between the first input 48 of the interlock detector 50 and the differential amplifier 20 via a respective switching means 35, 36. The third second input 43 is connected to the first input 48 of the interlock detector 50 via a switching means 37 and via the first or second input of the differential amplifier 20. The remaining second input 44 is connected to the input of the comparator circuit 10 between the comparator circuit 10 and the switching means 38 or to the connecting piece between the comparator circuit 10 and the differential amplifier 20 via a switching means 34. All second inputs 41, 42, 43, 44 of the interlock detector 50 are connected to the microprocessor 30 via a line resistor 70 and via particularly configured low-pass filters 72, 78. The low-pass filter in the connection to the two second inputs 41, 44 consists of a low-pass filter resistor 71 in the connection and a capacitor 73, the first end of which is connected to ground and the second end of which, between the line resistor 70 and the low-pass filter resistor 71, is connected to the respective connection. The low-pass filter in the connection to the other two second inputs 42, 43 consists of a parallel circuit comprising a low-pass filter resistor 77 and a capacitor 79, the first ends of which are connected to ground and the second ends of which, between the microprocessor 30 and the line resistor 70, are connected to the respective connection.

For a self-diagnosis, the switching means 32, 33 in the interlock circuit 60 can first of all be opened and the interlock detector 50 can therefore be decoupled from the interlock circuit 60. Purely by way of example, the microprocessor 30 is used to generate pulse-width-modulated diagnosis signals which are demodulated via the low-pass filters 72, 78 in the connections and are passed to at least one of the second inputs 41, 42, 43, 44 of the interlock detector 50. When the switching means 35, 36 are closed, the diagnosis signals are supplied to one of the first or second inputs of the differential amplifier 20 between the first input 48 and the differential amplifier 20. When the switching means 37 is closed, a diagnosis signal is additionally supplied to the first input 48 of the interlock detector 50 which, in this special exemplary embodiment, is formed from a measuring resistor 4 and the two inputs of the differential amplifier 20. In this case, the switching means 38 is also closed, with the result that the diagnosis signal amplified by the differential amplifier 20 can be transmitted to the input of the comparator circuit 10 via the output of the differential amplifier 20. In the comparator circuit 10, the output signal from the differential amplifier 20 is compared with an upper limit value and a lower limit value, and an output signal from the comparator circuit 10, which corresponds to the result of the comparison, is transmitted to the microprocessor 30. Alternatively or additionally, closing the switching means 34 results in a diagnosis signal being supplied to the input of the comparator circuit 10 between the comparator circuit 10 and the differential amplifier 20 or to the connecting piece between the comparator circuit 10 and the differential amplifier 20. If only the functionality of the comparator circuit is intended to be checked in this case, the connection between the comparator circuit 10 and the differential amplifier 20 is interrupted by opening the switching means 38. The output signal from the comparator circuit 10, which is caused by the diagnosis signals, is evaluated in the microprocessor 30. The second input 44 is therefore used to check the functionality of the comparator circuit 10. It can be used to deliberately individually control the comparator thresholds of the comparator circuit 10, for example. The second input 41 is used to check the function of the differential amplifier 20 and to test one of its inputs. The second input 42 can be used to check the other input of the differential amplifier 20. Alternatively or additionally, it can also be used to concomitantly include the offset voltage, which can be supplied to the respective input of the differential amplifier, in the test. The second input 43 can be used to check the integrity of the first input of the interlock detector which, in this exemplary embodiment, is implemented by means of a measuring resistor 4 and the inputs of the differential amplifier 20. Four second inputs are shown purely by way of example in FIG. 3. However, only one second input, two second inputs or three second inputs can also be present in any desired combination. At least one second input 44 is preferably provided for the purpose of diagnosing a comparator circuit 10, one second input 41 or 42 is provided for the purpose of diagnosing the differential amplifier 20 and one second input 43 is provided for the purpose of diagnosing the first input 48 of the interlock detector 50.

The invention claimed is:

1. An interlock detector comprising:
a first differential input of the interlock detector configured to connect to a signal loop of an interlock circuit to receive a first signal from an interlock generator arranged in the signal loop of the interlock circuit;
an output of the interlock detector configured to connect to a microprocessor and provide the microprocessor with a second signal;
a differential amplifier circuit having at least one amplifier, the differential amplifier circuit having a first input, a second input, and an output, the first input of the differential amplifier circuit and the second input of the differential amplifier circuit being connected to the first differential input of the interlock detector;
a comparator circuit having at least one comparator, the comparator circuit having an input and an output, the input of the comparator circuit being connected to the output of the differential amplifier circuit, the output of the comparator circuit being connected to the output of the interlock detector;
at least one second input of the interlock detector configured to receive at least one a diagnosis signal, the at least one second input of the interlock detector being connected at least one of (i) the input of the comparator circuit, (ii) the first input of the differential amplifier circuit, and (iii) the second input of the differential amplifier circuit.

2. The interlock detector as claimed in claim 1, wherein:
the at least one second input of the interlock detector is a plurality of second inputs of the interlock detector;
a first of the plurality of second inputs of the interlock detector is connected to the first input of the differential amplifier circuit;
a second of the plurality of second inputs of the interlock detector is connected to the second input of the differential amplifier circuit;
a third of the plurality of second inputs of the interlock detector is connected to the input of the comparator circuit; and
a fourth of the plurality of second inputs of the interlock detector is connected to the first differential input of the interlock detector.

3. The interlock detector as claimed in claim 1, further comprising:
a switch connected between the output of the differential amplifier circuit and the input of the comparator circuit, the switch being configured to interrupt a connection between the output of the differential amplifier circuit and the input of the comparator circuit to diagnose the comparator circuit.

4. The interlock detector as claimed in claim 3, wherein:
the at least one second input is connected to the input of the comparator circuit and configured to provide the diagnosis signal to the input of the comparator circuit; and
the switch is connected upstream of the connection between the at least one second input and the input of the comparator circuit.

5. The interlock detector as claimed in claim 1, further comprising:
a switch connected between the at least one second input of the interlock detector and the at least one of (i) the input of the comparator circuit, (ii) the first input of the differential amplifier circuit, and (iii) the second input of the differential amplifier circuit.

6. An interlock detector system comprising:
an interlock circuit having a signal loop and an interlock generator arranged in the signal loop, the interlock generator being configured to generate a first signal in the signal loop;
a microprocessor; and
an interlock detector, the interlock detector comprising:

a first differential input of the interlock detector configured to connect to the signal loop of the interlock circuit to receive the a first signal from the interlock generator of the interlock circuit;

an output of the interlock detector configured to connect to the microprocessor and provide the microprocessor with a second signal;

a differential amplifier circuit having at least one amplifier, the differential amplifier circuit having a first input, a second input, and an output, the first input of the differential amplifier circuit and the second input of the differential amplifier circuit being connected to the first differential input of the interlock detector;

a comparator circuit having at least one comparator, the comparator circuit having an input and an output, the input of the comparator circuit being connected to the output of the differential amplifier circuit, the output of the comparator circuit being connected to the output of the interlock detector;

at least one second input of the interlock detector configured to receive at least one a diagnosis signal, the at least one second input of the interlock detector being connected at least one of (i) the input of the comparator circuit, (ii) the first input of the differential amplifier circuit, and (iii) the second input of the differential amplifier circuit, wherein the microprocessor is connected to the at least one second input of the interlock detector and configured to (i) provide the diagnosis signal to the at least one second input of the interlock detector and (ii) evaluate the second signal provided by the output of the interlock detector.

7. The interlock detector system as claimed in claim 6, wherein the microprocessor is configured to generate the diagnosis signals for the interlock detector via pulse width modulation signals and a respective low-pass filter between the microprocessor and the at least one second input of the interlock detector.

8. The interlock detector system as claimed in claim 6, further comprising at least one switch arranged in the signal loop of the interlock circuit between the first differential input of the interlock detector and the interlock generator of the interlock circuit.

9. The interlock detector as claimed in claim 1, wherein the interlock detector is comprised by a battery.

10. The interlock detector as claimed in claim 9, wherein the battery is comprised by a motor vehicle.

* * * * *